(12) United States Patent
King et al.

(10) Patent No.: US 7,154,414 B2
(45) Date of Patent: Dec. 26, 2006

(54) SYSTEM AND METHOD FOR REMOTE TIRE PRESSURE MONITORING

(75) Inventors: Ronald O. King, Brownstown, MI (US); John S. Nantz, Brighton, MI (US); Qingfeng Tang, Novi, MI (US)

(73) Assignee: Lear Corporation, Southfield, MI (US)

( * ) Notice: Subject to any disclaimer, the term of this patent is extended or adjusted under 35 U.S.C. 154(b) by 437 days.

(21) Appl. No.: 10/295,112

(22) Filed: Nov. 15, 2002

(65) Prior Publication Data

US 2003/0164774 A1 Sep. 4, 2003

Related U.S. Application Data

(60) Provisional application No. 60/360,762, filed on Mar. 1, 2002.

(51) Int. Cl.
| | |
|---|---|
| B60C 23/02 | (2006.01) |
| B60C 23/00 | (2006.01) |
| G08C 17/00 | (2006.01) |
| G08C 19/12 | (2006.01) |
| E01C 23/00 | (2006.01) |
| G01M 17/02 | (2006.01) |
| G08C 19/00 | (2006.01) |
| B60R 25/10 | (2006.01) |

(52) U.S. Cl. ............... 340/870.28; 340/870.27; 340/426.16; 340/442; 340/825.69; 73/146; 73/146.4; 307/10.1

(58) Field of Classification Search ............. 455/127.1, 455/127.5; 340/870.39, 870.28, 539.1, 539.22, 340/870.27, 3.4, 42, 425.5, 426.16, 825.69; 73/146.4, 146; 116/34.8; 307/10.1
See application file for complete search history.

(56) References Cited

U.S. PATENT DOCUMENTS

| | | | |
|---|---|---|---|
| 3,580,353 A | 5/1971 | Thompson | |
| 3,723,966 A | 3/1973 | Mueller et al. | |
| 3,916,688 A | 11/1975 | Dendy et al. | |
| 4,067,235 A | 1/1978 | Markland et al. | |
| 4,101,870 A | 7/1978 | Ekman | |
| 4,330,774 A | 5/1982 | Doty | |
| 4,450,431 A | 5/1984 | Hochstein | |
| 4,468,650 A | 8/1984 | Barbee | |

(Continued)

FOREIGN PATENT DOCUMENTS

DE 2656235 6/1978

(Continued)

OTHER PUBLICATIONS

UK Search Report dated Jun. 13, 2003.

(Continued)

Primary Examiner—Jeffery Hofsass
Assistant Examiner—Sisay Yacob
(74) Attorney, Agent, or Firm—Brooks Kushman P.C.

(57) ABSTRACT

A system and method for monitoring vehicle tire pressure. A tire pressure monitor for each tire includes a pressure sensor for sensing tire pressure, a transmitter for transmitting a tire pressure signal representative of the sensed tire pressure, and a batter providing power to the transmitter. To conserve battery power, each tire pressure signal transmitted by the transmitters includes a wake-up signal only when the vehicle has been stationary for a predetermined time period. The wake-up signal ensures receipt of the tire pressure signal by a vehicle mounted receiver alternating between active state and inactive states.

28 Claims, 1 Drawing Sheet

U.S. PATENT DOCUMENTS

| | | | |
|---|---|---|---|
| 4,570,152 A | 2/1986 | Melton et al. | |
| 4,609,905 A | 9/1986 | Uzzo | |
| 4,660,528 A | 4/1987 | Buck | |
| 4,670,845 A | 6/1987 | Etoh | |
| 4,684,853 A | 8/1987 | Coash | |
| 4,717,905 A | 1/1988 | Morrison, Jr. et al. | |
| 4,749,993 A | 6/1988 | Szabo et al. | |
| 4,758,969 A | 7/1988 | Andre et al. | |
| 4,761,830 A | 8/1988 | Izumi | |
| 4,951,208 A | 8/1990 | Etoh | |
| 4,978,941 A * | 12/1990 | Brown | 340/447 |
| 5,040,561 A | 8/1991 | Achterholt | |
| 5,109,213 A | 4/1992 | Williams | |
| 5,156,230 A | 10/1992 | Washburn | |
| 5,165,497 A | 11/1992 | Chi | |
| 5,285,189 A * | 2/1994 | Nowicki et al. | 340/447 |
| 5,289,160 A | 2/1994 | Fiorletta | |
| 5,300,875 A | 4/1994 | Tuttle | |
| 5,335,541 A | 8/1994 | Sharpe | |
| 5,444,448 A | 8/1995 | Schuermann et al. | |
| 5,451,959 A | 9/1995 | Schuermann | |
| 5,461,385 A | 10/1995 | Armstrong | |
| 5,463,374 A | 10/1995 | Mendez et al. | |
| 5,473,938 A | 12/1995 | Handfield et al. | |
| 5,479,171 A | 12/1995 | Schuermann | |
| 5,483,827 A | 1/1996 | Kulka et al. | |
| 5,485,381 A | 1/1996 | Heintz et al. | |
| 5,500,637 A | 3/1996 | Kokubu | |
| 5,505,080 A | 4/1996 | McGhee | |
| 5,515,014 A | 5/1996 | Troutman | |
| 5,531,109 A | 7/1996 | Tsagas | |
| 5,562,787 A | 10/1996 | Koch et al. | |
| 5,573,610 A | 11/1996 | Koch et al. | |
| 5,573,611 A | 11/1996 | Koch et al. | |
| 5,585,554 A | 12/1996 | Handfield et al. | |
| 5,600,301 A | 2/1997 | Robinson, III | |
| 5,602,524 A | 2/1997 | Mock et al. | |
| 5,654,689 A | 8/1997 | Peyre et al. | |
| 5,661,651 A | 8/1997 | Geschke et al. | |
| 5,677,667 A | 10/1997 | Lesesky et al. | |
| 5,705,746 A | 1/1998 | Trost et al. | |
| 5,717,376 A | 2/1998 | Wilson | |
| 5,724,028 A | 3/1998 | Prokup | |
| 5,728,933 A | 3/1998 | Schultz et al. | |
| 5,731,754 A | 3/1998 | Lee et al. | |
| 5,740,548 A | 4/1998 | Hudgens | |
| 5,741,966 A | 4/1998 | Handfield et al. | |
| 5,753,809 A | 5/1998 | Ogusu et al. | |
| 5,760,682 A | 6/1998 | Liu et al. | |
| 5,774,047 A | 6/1998 | Hensel, IV | |
| 5,783,992 A | 7/1998 | Eberwine et al. | |
| 5,822,683 A | 10/1998 | Paschen | |
| 5,835,868 A | 11/1998 | McElroy et al. | |
| 5,838,229 A | 11/1998 | Robinson, III | |
| 5,844,130 A | 12/1998 | Hilgart et al. | |
| 5,853,020 A | 12/1998 | Widner | |
| 5,880,363 A | 3/1999 | Meyer et al. | |
| 5,883,305 A | 3/1999 | Jo et al. | |
| 5,900,808 A | 5/1999 | Lebo | |
| 5,920,234 A | 7/1999 | Hill | |
| 5,926,087 A | 7/1999 | Busch et al. | |
| 5,929,620 A | 7/1999 | Dobkin et al. | |
| 5,939,977 A | 8/1999 | Monson | |
| 5,942,971 A | 8/1999 | Fauci et al. | |
| 5,959,365 A | 9/1999 | Mantini et al. | |
| 5,963,128 A | 10/1999 | McClelland | |
| 5,999,091 A | 12/1999 | Wortham | |
| 6,002,327 A | 12/1999 | Boesch et al. | |
| 6,025,777 A | 2/2000 | Fuller et al. | |
| 6,034,596 A | 3/2000 | Smith et al. | |
| 6,034,597 A | 3/2000 | Normann et al. | |
| 6,043,738 A | 3/2000 | Stewart et al. | |
| 6,043,752 A | 3/2000 | Hisada et al. | |
| 6,053,038 A | 4/2000 | Schramm et al. | |
| 6,060,984 A | 5/2000 | Braun et al. | |
| 6,087,930 A | 7/2000 | Kulka et al. | |
| 6,111,520 A | 8/2000 | Allen et al. | |
| 6,112,587 A | 9/2000 | Oldenettel | |
| 6,118,369 A | 9/2000 | Boesch | |
| 6,127,939 A | 10/2000 | Lesesky et al. | |
| 6,169,480 B1 | 1/2001 | Uhl et al. | |
| 6,175,302 B1 | 1/2001 | Huang | |
| 6,175,787 B1 | 1/2001 | Breed | |
| 6,181,241 B1 | 1/2001 | Normann et al. | |
| 6,204,758 B1 | 3/2001 | Wacker et al. | |
| 6,232,875 B1 | 5/2001 | DeZorzi | |
| 6,232,884 B1 | 5/2001 | Gabbard | |
| 6,239,753 B1 | 5/2001 | Kado et al. | |
| 6,243,007 B1 | 6/2001 | McLaughlin et al. | |
| 6,246,317 B1 | 6/2001 | Pickornik et al. | |
| 6,252,498 B1 | 6/2001 | Pashayan, Jr. | |
| 6,255,940 B1 | 7/2001 | Phelan et al. | |
| 6,259,361 B1 | 7/2001 | Robillard et al. | |
| 6,259,362 B1 * | 7/2001 | Lin | 340/457 |
| 6,275,148 B1 | 8/2001 | Takamura et al. | |
| 6,278,363 B1 * | 8/2001 | Bezek et al. | 340/442 |
| 6,292,095 B1 | 9/2001 | Fuller et al. | |
| 6,304,610 B1 | 10/2001 | Monson | |
| 6,329,917 B1 | 12/2001 | Leonard | |
| 6,340,929 B1 | 1/2002 | Katou et al. | |
| 6,362,731 B1 | 3/2002 | Lill | |
| 6,369,703 B1 | 4/2002 | Lill | |
| 6,384,720 B1 | 5/2002 | Juzswik et al. | |
| 6,408,690 B1 | 6/2002 | Young et al. | |
| 6,417,766 B1 | 7/2002 | Starkey | |
| 6,420,967 B1 | 7/2002 | Ghabra et al. | |
| 6,441,728 B1 | 8/2002 | Dixit et al. | |
| 6,445,287 B1 | 9/2002 | Schofield et al. | |
| 6,476,712 B1 | 11/2002 | Achterhold | |
| 6,489,888 B1 | 12/2002 | Honeck et al. | |
| 6,499,343 B1 | 12/2002 | Haas et al. | |
| 6,501,372 B1 | 12/2002 | Lin | |
| 6,518,877 B1 | 2/2003 | Starkey et al. | |
| 6,543,279 B1 | 4/2003 | Yones et al. | |
| 6,571,617 B1 | 6/2003 | Van Niekerk et al. | |
| 6,581,449 B1 | 6/2003 | Brown et al. | |
| 6,609,419 B1 | 8/2003 | Bankart et al. | |
| 6,612,165 B1 | 9/2003 | Juzswik et al. | |
| 6,885,282 B1 * | 4/2005 | Desai et al. | 340/5.61 |
| 2001/0008083 A1 | 7/2001 | Brown | |
| 2002/0030592 A1 | 3/2002 | Hakanen et al. | |
| 2002/0130771 A1 * | 9/2002 | Osborne et al. | 340/438 |
| 2003/0201879 A1 | 10/2003 | Munch et al. | |

FOREIGN PATENT DOCUMENTS

| | | |
|---|---|---|
| DE | 35 14 438 | 9/1986 |
| DE | 3514439 | 10/1986 |
| DE | 4232240 A | 3/1994 |
| DE | 197 37 945 A1 | 3/1999 |
| DE | 10237699 | 7/2003 |
| EP | 0 016 991 A | 10/1980 |
| EP | 0 646 985 A1 | 4/1995 |
| EP | 0671289 A1 | 9/1995 |
| EP | 0 753 897 A2 | 1/1997 |
| EP | 0 760 299 A1 | 3/1997 |
| EP | 0995619 A1 | 4/2000 |
| EP | 1059177 | 12/2000 |
| EP | 1 113 582 A2 | 7/2001 |
| EP | 1 172 236 | 1/2002 |
| EP | 1 211 104 A2 | 6/2002 |
| EP | 1 215 056 A2 | 6/2002 |
| EP | 1 262 339 A1 | 12/2002 |
| EP | 1 267 021 A1 | 12/2002 |

| | | | |
|---|---|---|---|
| EP | 1 215 056 A3 | 4/2003 |
| FR | 2801728 A | 6/2001 |
| GB | 1483735 | 8/1977 |
| GB | 2179480 A | 3/1987 |
| GB | 2318696 A | 4/1998 |
| GB | 2363463 A | 12/2001 |
| GB | 2381972 A | 5/2003 |
| JP | 260212 A1 | 2/1990 |
| JP | 8244424 A | 3/1995 |
| JP | 10-107548 A | 4/1998 |
| JP | 2001-007712 A | 1/2001 |
| WO | WO 01/08614 | 6/1991 |
| WO | WO 96/15919 | 5/1996 |
| WO | WO 98/26946 | 6/1998 |
| WO | WO 99/29523 | 6/1999 |
| WO | WO 01/26069 A1 | 4/2001 |
| WO | WO 01/69803 | 9/2001 |
| WO | WO 01-76007 A1 | 10/2001 |
| WO | WO 01/81104 A1 | 11/2001 |
| WO | WO 02/057097 | 7/2002 |
| WO | WO 02/072369 A1 | 9/2002 |
| WO | WO 02/093857 A1 | 11/2002 |
| WO | WO/03103993 | 12/2003 |

OTHER PUBLICATIONS

"Elektronisches Reifendruck-Kontrollsystem" and English translation thereof.

* cited by examiner

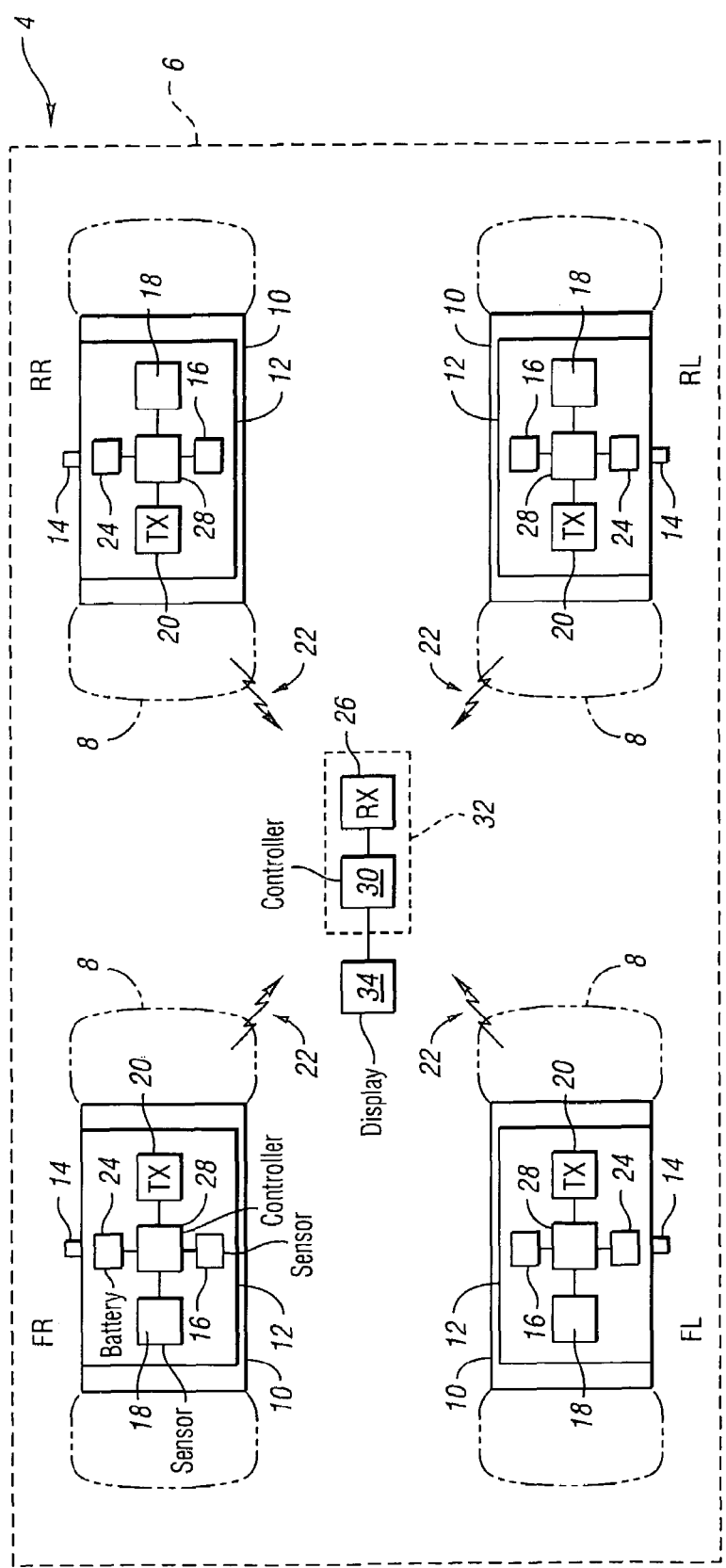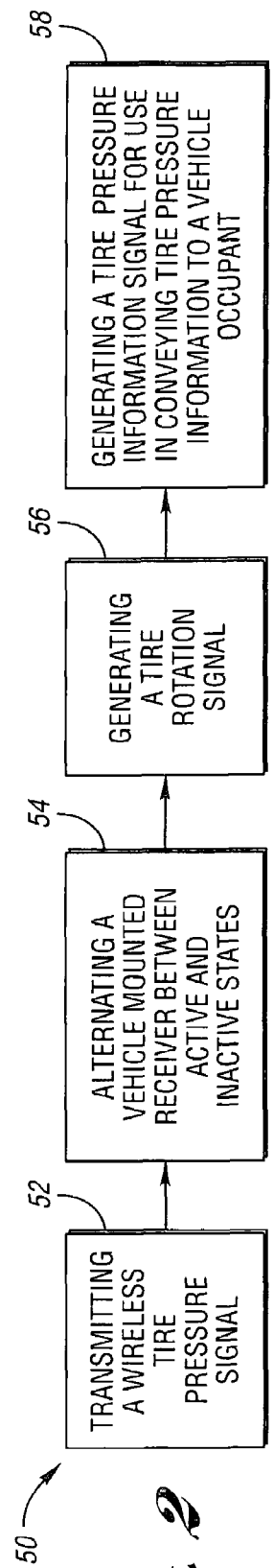

SYSTEM AND METHOD FOR REMOTE TIRE PRESSURE MONITORING

CROSS-REFERENCE TO RELATED APPLICATION

This application claims the benefit of U.S. provisional application Ser. No. 60/360,762, filed Mar. 1, 2002.

BACKGROUND OF THE INVENTION

1. Field of the Invention

The present invention relates generally to wireless vehicle tire pressure monitoring and, more particularly, to a system and method for wireless vehicle tire pressure monitoring with improved operating efficiency.

2. Background Art

It is known in the automotive industry to provide for remote monitoring of vehicle tire parameters, particularly tire pressure. In such tire pressure monitoring systems, tire pressure sensors and radio frequency (RF) transmitters are mounted inside each tire, typically adjacent the inflation valve stem. In each tire, the tire pressure sensed by the tire pressure sensor is transmitted by the transmitter to a receiver located on-board the vehicle. The tire pressure information delivered to the receiver by the RF signals from the transmitters is subsequently conveyed to a vehicle operator or occupant, typically in the form of a display. Exemplary tire pressure monitoring systems are described and shown in U.S. Pat. Nos. 6,112,587 and 6,034,597.

The vehicle mounted receivers used in such tire pressure monitoring systems have super-regenerative topologies. It is well known that such receivers do not draw a great deal of current, and can therefore be left on or active at all times. As they are left on at all times, such receivers can detect all tire pressure information transmitted by the tire transmitters.

Such receivers, however, have low sensitivity and, in turn, lower performance. Newer receiver topologies, such as super-heterodyne, have much better performance. However, such newer receivers draw more current than receivers with older topologies. While the vehicle is on, this presents no problem and the newer receivers can be left on. However, when the vehicle is off, to meet current specifications, such receivers must be strobed on and off to keep current levels below a maximum. As a result, when the vehicle is off, it is necessary for tire transmitters to transmit a wake-up tone or signal to give the receiver time to wake-up and read the incoming tire pressure information from the tire transmitters.

The tire transmitters used in such tire pressure monitoring systems are typically battery powered. As a result, a transmitter has a limited amount of functioning time before its battery must be replaced. Transmitters typically transmit tire pressure information at short, predetermined time intervals when the vehicle is moving. To help conserve battery power, once the vehicle has been stationary for a predetermined amount of time, the transmitters transmit tire pressure information at longer predetermined time intervals.

As noted above, however, newer vehicle mounted receivers alternate between active and inactive states when the vehicle is off in order to reduce current draw. As a result, tire pressure information from tire transmitters must include a wake-up tone or signal to ensure receipt by such receivers. However, transmitting such a wake-up signal, such as in the form of a preamble or a header at the beginning of a message including tire pressure information, further shortens the limited life of a transmitter battery.

Thus, there exists a need for an improved tire pressure monitoring system and method. Such an improved system and method would include a wake-up tone or signal to ensure receipt of tire pressure information by a receiver alternating between active and inactive states. To improve operating efficiency, such a system and method would transmit such a wake-up signal only when the vehicle has been stationary for a predetermined time period, thereby facilitating conservation of transmitter battery life.

DISCLOSURE OF THE INVENTION

Accordingly, the present invention provides an improved vehicle tire pressure monitoring system and method. In one exemplary embodiment, a system is provided for remote monitoring of tire pressure in a vehicle having a plurality of tires. The system comprises a plurality of tire monitors, each monitor for mounting in one of the plurality of tires. Each monitor comprises a sensor for sensing tire pressure, and a transmitter for transmitting a wireless signal representative of the sensed tire pressure. The system further comprises a receiver for mounting on-board the vehicle for receiving the tire pressure signals. The receiver has at least an inactive state when the vehicle is off. A tire pressure signal transmitted by a transmitter has associated therewith a wake-up signal when the vehicle has been stationary for a predetermined time period. The wake-up signal is provided to ensure receipt by the receiver of the tire pressure signal when the receiver is in the inactive state. A tire pressure signal transmitted by a transmitter lacks an associated wake-up signal at least once when the vehicle has not been stationary for the predetermined time period.

In another exemplary embodiment, a method is provided for remote monitoring of tire pressure in a vehicle having a plurality of tires. The method comprises providing a plurality of tire monitors, each monitor for mounting in one of the plurality of tires. Each monitor comprises a sensor for sensing tire pressure, and a transmitter for transmitting a wireless signal representative of the sensed tire pressure. A tire pressure signal transmitted by a transmitter has associated therewith a wake-up signal when the vehicle has been stationary for a predetermined time period. The wake-up signal is provided to ensure receipt of the tire pressure signal by a vehicle mounted receiver in an inactive state. A tire pressure signal transmitted by a transmitter lacks an associated wake-up signal at least once when the vehicle has not been stationary for the predetermined time period.

In yet another exemplary embodiment, a method is provided for remote monitoring of tire pressure in a vehicle. The method comprises transmitting from a tire mounted transmitter a wireless signal representative of a sensed tire pressure, and placing a vehicle mounted receiver for receiving the tire pressure signal in at least an inactive state when the vehicle is off. The tire pressure signal has associated therewith a wake-up signal when the vehicle has been stationary for a predetermined time period, the wake-up signal being provided to ensure receipt by the receiver of the tire pressure signal when the receiver is in the inactive state. A tire pressure signal transmitted by a transmitter lacks an associated wake-up signal at least once when the vehicle has not been stationary for the predetermined time period.

Instill another exemplary embodiment, a method is provided for remote monitoring of tire pressure in a vehicle having a plurality of tires. The method comprises providing a receiver for mounting on-board the vehicle for receiving wireless signals representative of a sensed tire pressure, the receiver having at least an inactive state when the vehicle is off. Each of the plurality of tires has a tire monitor for use in transmitting wireless tire pressure signals. A tire pressure signal has associated therewith a wake-up signal when the vehicle has been stationary for a predetermined time period. The wake-up signal is provided to ensure receipt by the receiver of the tire pressure signal when the receiver is in the inactive state. A tire pressure signal transmitted by a transmitter lacks an associated wake-up signal at least once when the vehicle has not been stationary for the predetermined time period.

The following detailed description and accompanying drawings set forth preferred embodiments of the present invention.

BRIEF DESCRIPTION OF DRAWINGS

FIG. 1 is a simplified, representative block diagram of one embodiment of the tire pressure monitoring system of the present invention; and FIG. 2 is a simplified, representative flowchart of one embodiment of the tire pressure monitoring method of the present invention.

DETAILED DESCRIPTION OF THE PREFERRED EMBODIMENTS

Referring to the Figures, preferred embodiments of the present invention will now be described. As previously noted, it is known in the automotive industry to provide for remote monitoring of vehicle tire parameters, particularly tire pressure. In such tire pressure monitoring systems, tire pressure sensors and radio frequency (RF) transmitters are mounted inside each tire, typically adjacent the inflation valve stem. In each tire, the tire pressure sensed by the tire pressure sensor is transmitted by the transmitter to a receiver located on-board the vehicle. The tire pressure information delivered to the receiver by the RF signals from the transmitters is subsequently conveyed to a vehicle operator or occupant, typically in the form of a display.

As also previously noted, the vehicle mounted receivers used in such tire pressure monitoring systems have super-regenerative topologies. Such receivers do not draw a great deal of current, and can therefore be left on or active at all times. As they are left on at all times, such receivers can detect all tire pressure information transmitted by the tire transmitters.

Such receivers, however, have low sensitivity and, in turn, lower performance. Newer receiver topologies, such as super-heterodyne, have much better performance. However, such newer receivers draw more current than receivers with older topologies. While the vehicle is on, this presents no problem and the newer receivers can be left on. However, when the vehicle is off, to meet current specifications, such receivers must be strobed on and off to keep current levels below a maximum. As a result, when the vehicle is off, it is necessary for tire transmitters to transmit a wake-up tone or signal to give the receiver time to wake-up and read the incoming tire pressure information from the tire transmitters.

As noted above, the tire transmitters used in such tire pressure monitoring systems are typically battery powered. As a result, a transmitter has a limited amount of functioning time before its battery must be replaced. Transmitters typically transmit tire pressure information at short, predetermined time intervals when the vehicle is moving. To help conserve battery power, once the vehicle has been stationary for a predetermined amount of time, the transmitters transmit tire pressure information at longer predetermined time intervals.

Once again, however, newer vehicle mounted receivers alternate between active and inactive states when the vehicle is off in order to reduce current draw. As a result, tire pressure information from tire transmitters must include a wake-up tone or signal to ensure receipt by such receivers. However, transmitting such a wake-up signal, such as in the form of a preamble or a header at the beginning of a message including tire pressure information, further shortens the limited life of a transmitter battery.

Thus, there exists a need for an improved tire pressure monitoring system and method. Such an improved system and method would include a wake-up tone or signal to ensure receipt of tire pressure information by a receiver alternating between active and inactive states. To improve operating efficiency, such a system and method would transmit such a wake-up signal only when the vehicle has been stationary for a predetermined time period, thereby facilitating conservation of transmitter battery life.

Referring now to FIG. 1, a simplified, representative block diagram of one embodiment of the system of the present invention for automatically identifying tire location in a tire pressure monitoring system is shown, denoted generally by reference numeral 4. As seen therein, the system (4) is designed for use in a vehicle (6) having a plurality of tires (8), each tire (8) having a rim (10). It should be noted here that while the present invention is shown herein for use in an automotive vehicle having four tires, such an environment is exemplary only. That is, the present invention is suitable for use in any type of vehicle having any number of tires.

The system (4) preferably includes a plurality of tire monitors (12). Each tire monitor (12) is provided for mounting in one of the plurality of tires (8). In that regard, each tire monitor (12) is preferably mounted inside the tire (8) on rim (10) adjacent the tire inflation valve stem (14), although any mounting location known in the art may be used. Each tire monitor (12) preferably includes an appropriate sensor (16) for sensing, determining and/or monitoring the pressure of the associated tire (8). It should be noted that each tire monitor (12) may also be equipped to sense, determine and/or monitor any number of tire parameters in addition to pressure including, but not limited to, temperature and/or speed, in any fashion known in the art. Each tire monitor (12) also preferably includes a rotation sensor (18) for use in sensing rotation of the associated tire (8) in any fashion known in the art. As will be described in greater detail below, such a sensed rotation of tire (8) by rotation sensor (18) is for use in determining whether vehicle (6) is stationary or in motion.

Still referring to FIG. 1, each tire monitor (12) also includes a transmitter (20) in communication with pressure sensor (16). Transmitters (20) transmit wireless tire pressure signals (22) representative of the tire pressure sensed by pressure sensor (16). Tire pressure signals (22) are for use in conveying pressure information for tire (8) to a vehicle occupant (not shown). In that regard, tire pressure signals (22) are preferably radio frequency (RF) signals, although other signal types known in the art could be employed. It should be noted that transmitters (20) may also transmit, as part of or separate from tire pressure signals (22), a signal or signals representative of any of a number of other tire parameters in addition to pressure, such as temperature and/or speed as sensed, measured and/or determined by an appropriately equipped tire monitor (12).

Each tire monitor (12) also includes a battery (24). As is well known in the art, battery (24) is for use in providing power to at least transmitter (20). In that regard, transmitters (20) may also transmit, again as part of or separate from tire pressure signals (22), a signal or signals representative of the status of such a battery (24), including a low battery status. As will be described in greater detail below, information concerning tire pressure, possibly with information concerning any other tire and/or battery parameters, is ultimately conveyed to a vehicle operator (not shown). This is typically accomplished using a visual display, although audible means such as tones or speech may also be used.

Referring still to FIG. 1, the tire pressure monitoring system (4) of the present invention also includes a receiver (26) for mounting on vehicle (6) for receiving the tire pressure signals (22) transmitted by transmitters (20). In that regard, receiver (26) may comprise one or more antenna (not shown) to be located at one or more selected sites on vehicle (6). As previously noted, for improved performance, receiver (26) has a super-heterodyne topology. When vehicle (6) is on, receiver (26) can remain active at all times. However, as described above, to reduce current draw, receiver (26) alternates between an active and an inactive state when vehicle (6) is off.

As a result, as also previously noted, tire pressure information from tire transmitters (20) must include a wake-up tone or signal to ensure receipt by such receiver (26). However, transmitting such a wake-up signal, such as in the form of a preamble or a header at the beginning of a message including tire pressure information, further shortens the limited life of a transmitter battery (24). According to a preferred embodiment of the present invention, each tire pressure signal (22) transmitted by the transmitters (20) includes a wake-up signal (not shown) only when vehicle (6) has been stationary for a predetermined time period. When vehicle (6) has not been stationary for the predetermined time period, no wake-up signal is employed. In such a fashion, the present invention further conserves the life of transmitter batteries (24).

The wake-up signal is provided with tire pressure signal (22) to ensure receipt by receiver (26) of the tire pressure signal (22) when receiver (26) alternates between active and inactive states. While the wake-up signals are preferably provided with the tire pressure signals (22), such as in the form of a preamble or a header to the tire pressure signals (22), it should be noted that the wake-up signals could also be provided separately from the tire pressure signals (22). It should also be noted that the wake-up signals and tire pressure signals (22) may be modulated in any fashion known in the art, such as by Amplitude Shift Keying (ASK) or Frequency Shift Keying (FSK). Indeed, in that regard, the wake-up signals and tire pressure signals (22) may be modulated in the same or different fashions (i.e., ASK modulation for the wake-up signals and FSK modulation for the tire pressure signals), whether transmitted together or separately.

Referring still to FIG. 1, as previously described, each tire monitor (12) includes a rotation sensor (18) for sensing rotation of the associated tire (8). Preferably, each tire monitor also includes a controller (28). Controller (28), which preferably comprises an appropriately programmed microprocessor or DSP, is provided in communication with rotation sensor (18) and transmitter (20). Rotation sensor (18) generates a signal (not shown) representative of the sensed rotation of the associated tire (8). Such a signal is used by controller (28) in determining if vehicle (6) is in motion or stationary and, if stationary, whether vehicle (6) has been stationary in excess of the predetermined time period. If controller (28) determines that vehicle (6) has been stationary for the predetermined time period, controller (28) causes transmitter (20) to include a wake-up signal with any tire pressure signal (22). Preferably, the predetermined time period is sufficiently long so that a wake-up signal is included with a tire pressure signal (22) substantially at those times when receiver (26) is alternating between active and inactive states (i.e., when vehicle (6) is off).

Still referring to FIG. 1, the system (4) of the present invention may further comprise a controller (30) for mounting on vehicle (6) and to be provided in communication with receiver (26). Controller (30), which also preferably comprises an appropriately programmed microprocessor or DSP, is for processing tire pressure signals (22) received by receiver (26) from transmitters (20), and for generating control signals (not shown) for use in conveying at least tire pressure information to a vehicle occupant. It should also be noted that receiver (26) and controller (30) may be part of a single control unit (32) for mounting on vehicle (6).

The system (4) may further comprise a display unit (34) for mounting inside the vehicle (6), the display unit (34) provided in communication with controller (30) and for use in conveying information, such as tire pressure, to a vehicle occupant (not shown). Display unit (34) may comprise an LED display or a lighted icon in a dashboard or console of vehicle (6) although, once again, audible means such as tones or speech may also be used to convey tire pressure information to a vehicle occupant. As described above, information concerning other tire parameters, such as temperature, speed and/or battery status, may also be conveyed to a vehicle occupant via controller (30) and display (34). It should be noted that the information conveyed to the vehicle occupant may include a warning, which may also be audible, if tire pressure, or other tire parameters, such as temperature, and/or battery status are outside recommended ranges.

Still referring to FIG. 1, each tire monitor (12), sensor (16, 18) and/or transmitter (20) preferably has a unique identification code associated therewith. Such identification codes serve to particularly associate monitors (12), sensors (16, 18) and/or transmitters (20) with vehicle (6). In that regard, each transmitter (20) also preferably transmits such identification code for receipt by receiver (26) and for use by controller (30) in determining that tire pressure signals (22) received by receiver (26) are associated with vehicle (6). Transmitters (20) may transmit the identification codes as part of tire pressure signal (22), or as a separate signal (not shown). In such a fashion, controller (30) disregards any tire pressure signals which may be transmitted from any nearby vehicle and received by receiver (26).

To further conserve the power of battery (24) in each monitor (12), transmitters (20) are preferably configured to transmit tire pressure signals (22) intermittently or periodically. In that regard, the particular period employed for such transmissions is not critical, and may be the same for each transmitter (20), or may differ from transmitter (20) to transmitter (20). Additionally, the period may be fixed or may vary in any fashion. For example, tire pressure signals (22) may be transmitted periodically by transmitters (20) only when tires (8) are in motion (i.e., only when rotation sensors (18) indicate that tires (8) are rotating), or only when the rotational speed of the tires (8) exceeds a selected threshold. In any event, as noted above, periodic transmission of tire pressure signals (22) by transmitters (20) provides for extended battery life.

Referring now to FIG. 2, a simplified, representative flowchart of one embodiment of the tire pressure monitoring method of the present invention is shown, denoted generally by reference numeral 50. As seen therein, the method (5) for remote monitoring of tire pressure in a vehicle comprises transmitting (52) from a tire mounted transmitter powered by a battery a wireless signal representative of a sensed tire pressure, and alternating (54) a vehicle mounted receiver for receiving the tire pressure signal between an active state and an inactive state when the vehicle is off to reduce a current drawn by the receiver.

As previously described, to conserve battery power, the tire pressure signal includes a wake-up signal only when the vehicle has been stationary for a predetermined time period, the wake-up signal being provided to ensure receipt by the receiver of the tire pressure signal when the receiver alternates between the active and inactive states.

The method (50) of the present invention may further comprise generating (56) a signal representative of a sensed tire rotation. As described in detail above, the tire rotation signal is provided for use in determining when the vehicle has been stationary for the predetermined time period. As also previously described, according to the method (50), to conserve battery power, the tire pressure signal is preferably transmitted periodically. In that regard, such a period may be variable, and preferably increases when the vehicle has been stationary for the predetermined time period.

Still further, the method (50) of the present invention may also comprise generating (58) at a vehicle mounted controller a tire pressure information signal based on the received tire pressure signal. As described in detail above, the tire pressure information signal is provided for use in conveying tire pressure information to a vehicle occupant.

It should be noted that the simplified flowchart depicted in FIG. 2 is exemplary of one embodiment of the method (50) of the present invention. In that regard, the method (50) may be executed in sequences other than those shown in FIG. 2, including the execution of a subset of the steps shown and/or the execution of one or more steps simultaneously.

From the foregoing description, it can be seen that the present invention provides an improved system and method for tire pressure monitoring. More particularly, the present invention provides a system and method that include a wake-up tone or signal to ensure receipt of tire pressure information by a receiver alternating between active and inactive states. To improve operating efficiency, the system and method of the present invention transmit such a wake-up signal only when the vehicle has been stationary for a predetermined time period, thereby facilitating conservation of transmitter battery life.

While various embodiments of the invention have been illustrated and described, it is not intended that these embodiments illustrate and describe all possible forms of the present invention. Rather, the words used in the specification are words of description rather than limitation, and it is understood that various changes may be made without departing from the spirit and scope of the invention. Indeed, many alternatives, modifications, and variations will be apparent to those skilled in the art in light of the foregoing description, and the present invention is intended to embrace all such alternatives.

What is claimed is:

1. A system for remote monitoring of tire pressure in a vehicle having a plurality of tires, the system comprising:
    a plurality of tire monitors, each monitor for mounting in one of the plurality of tires, each monitor comprising a sensor for sensing tire pressure, and a transmitter for transmitting a wireless signal representative of the sensed tire pressure; and
    a receiver for mounting on-board the vehicle for receiving the tire pressure signals, the receiver having at least an inactive state when the vehicle is off;
    wherein a tire pressure signal transmitted by a transmitter has associated therewith a wake-up signal when the vehicle has been stationary for a predetermined time period, the wake-up signal being provided to ensure receipt by the receiver of the tire pressure signal when the receiver is in the inactive state, and wherein a tire pressure signal transmitted by a transmitter lacks an associated wake-up signal at least once when the vehicle has not been stationary for the predetermined time period.

2. The system of claim 1 wherein each tire monitor further comprises a sensor for sensing rotation of the tire and for generating a signal representative of the sensed tire rotation, the tire rotation signal for use in determining when the vehicle has been stationary for the predetermined time period.

3. The system of claim 2 wherein each tire monitor further comprises a controller provided in communication with the rotation sensor, the controller for receiving the tire rotation signal and determining, using the tire rotation signal, if the vehicle has been stationary for the predetermined time period.

4. The system of claim 1 wherein the transmitter transmits the wake-up signal only when the vehicle has been stationary for the predetermined time period.

5. The system of claim 1 further comprising a controller for mounting on-board the vehicle and to be provided in communication with the receiver, the controller for processing the received tire pressure signals and for generating tire pressure information signals for use in conveying tire pressure information to a vehicle occupant.

6. The system of claim 4 wherein the wake-up signal and the tire pressure signal are transmitted using the same modulation scheme.

7. The system of claim 4 wherein the wake-up signal and the tire pressure signal are transmitted using different modulation schemes.

8. A method for remote monitoring of tire pressure in a vehicle having a plurality of tires, the method comprising:
    providing a plurality of tire monitors, each monitor for mounting in one of the plurality of tires, each monitor comprising a sensor for sensing tire pressure and a transmitter for transmitting a wireless signal representative of the sensed tire pressure;
    wherein a tire pressure signal transmitted by a transmitter has associated therewith a wake-up signal when the vehicle has been stationary for a predetermined time period, the wake-up signal being provided to ensure receipt of the tire pressure signal by a vehicle mounted receiver in an inactive state, and wherein a tire pressure signal transmitted by a transmitter lacks an associated wake-up signal at least once when the vehicle has not been stationary for the predetermined time period.

9. The method of claim 8 further comprising providing the receiver for mounting on-board the vehicle for receiving the tire pressure signals, the receiver alternating between the inactive state and an active state when the vehicle is off to reduce a current drawn by the receiver.

10. The method of claim 8 wherein each tire monitor further comprises a sensor for sensing rotation of the tire and for generating a signal representative of the sensed tire rotation, the tire rotation signal for use in determining when the vehicle has been stationary for the predetermined time period.

11. The method of claim 10 wherein each tire monitor further comprises a controller provided in communication with the rotation sensor, the controller for receiving the tire rotation signal and determining, using the tire rotation signal, if the vehicle has been stationary for the predetermined time period.

12. The method of claim 9 wherein the transmitter transmits the wake-up signal only when the vehicle has been stationary for the predetermined time period.

13. The method of claim 8 further comprising providing a controller for mounting on-board the vehicle, the controller to be provided in communication with the receiver, the controller for processing the received tire pressure signals and for generating tire pressure information signals for use in conveying tire pressure information to a vehicle occupant.

14. The method of claim 9 wherein the wake-up signal and the tire pressure signal are transmitted using the same modulation scheme.

15. The method of claim 9 wherein the wake-up signal and the tire pressure signal are transmitted using different modulation schemes.

16. A method for remote monitoring of tire pressure in a vehicle, the method comprising:
   transmitting from a tire mounted transmitter a wireless signal representative of a sensed tire pressure; and
   placing a vehicle mounted receiver for receiving the tire pressure signal in at least an inactive state when the vehicle is off;
   wherein the tire pressure signal has associated therewith a wake-up signal when the vehicle has been stationary for a predetermined time period, the wake-up signal being provided to ensure receipt by the receiver of the tire pressure signal when the receiver is in the inactive state, and wherein a tire pressure signal transmitted by a transmitter lacks an associated wake-up signal at least once when the vehicle has not been stationary for the predetermined time period.

17. The method of claim 16 further comprising generating a signal representative of a sensed tire rotation, the tire rotation signal for use in determining when the vehicle has been stationary for the predetermined time period.

18. The system of claim 16 wherein the wake-up signal and the tire pressure signal are transmitted using the same modulation scheme.

19. The system of claim 16 wherein the wake-up signal and the tire pressure signal are transmitted using different modulation schemes.

20. The method of claim 16 wherein the transmitter transmits the wake-up signal only when the vehicle has been stationary for the predetermined time period.

21. The method of claim 16 wherein the receiver alternates between the inactive state and an active state when the vehicle is off to reduce a current drawn by the receiver.

22. The method of claim 20 wherein the receiver alternates between the inactive state and an active state when the vehicle is off to reduce a current drawn by the receiver.

23. The system of claim 1 wherein the receiver alternates between the inactive state and an active state when the vehicle is off to reduce a current drawn by the receiver.

24. The system of claim 4 wherein the receiver alternates between the inactive state and an active state when the vehicle is off to reduce a current drawn by the receiver.

25. A method for remote monitoring of tire pressure in a vehicle having a plurality of tires, the method comprising:
   providing a receiver for mounting on-board the vehicle for receiving wireless signals representative of a sensed tire pressure, the receiver having at least an inactive state when the vehicle is off;
   wherein each of the plurality of tires has a tire monitor for use in transmitting wireless tire pressure signals; and
   wherein a tire pressure signal has associated therewith a wake-up signal when the vehicle has been stationary for a predetermined time period, the wake-up signal being provided to ensure receipt by the receiver of the tire pressure signal when the receiver is in the inactive state, and wherein a tire pressure signal transmitted by a transmitter lacks an associated wake-up signal at least once when the vehicle has not been stationary for the predetermined time period.

26. The method of claim 25 wherein the tire pressure signal includes the wake-up signal only when the vehicle has been stationary for the predetermined time period.

27. The method of claim 25 wherein the receiver alternates between the inactive state and an active state when the vehicle is off to reduce a current drawn by the receiver.

28. The method of claim 26 wherein the receiver alternates between the inactive state and an active state when the vehicle is off to reduce a current drawn by the receiver.

* * * * *